(12) United States Patent
Mori et al.

(10) Patent No.: US 10,047,909 B2
(45) Date of Patent: Aug. 14, 2018

(54) LIQUID SUPPLY SYSTEM

(71) Applicant: EAGLE INDUSTRY CO., LTD., Tokyo (JP)

(72) Inventors: Koichi Mori, Tokyo (JP); Kiyotaka Furuta, Tokyo (JP)

(73) Assignee: EAGLE INDUSTRY CO., LTD., Tokyo (JP)

( * ) Notice: Subject to any disclaimer, the term of this patent is extended or adjusted under 35 U.S.C. 154(b) by 0 days.

(21) Appl. No.: 14/431,619

(22) PCT Filed: Nov. 14, 2013

(86) PCT No.: PCT/JP2013/080818
§ 371 (c)(1),
(2) Date: Mar. 26, 2015

(87) PCT Pub. No.: WO2014/091866
PCT Pub. Date: Jun. 19, 2014

(65) Prior Publication Data
US 2015/0276131 A1  Oct. 1, 2015

(30) Foreign Application Priority Data
Dec. 14, 2012 (JP) ................. 2012-273717

(51) Int. Cl.
F17C 3/00 (2006.01)
F04B 45/02 (2006.01)
A61B 18/02 (2006.01)
F01B 31/22 (2006.01)
F17C 9/00 (2006.01)
(Continued)

(52) U.S. Cl.
CPC ................ *F17C 13/04* (2013.01); *F17C 9/00* (2013.01); *F25D 3/10* (2013.01); *F25D 17/02* (2013.01);
(Continued)

(58) Field of Classification Search
CPC .. F16K 17/00; F17C 13/04; F17C 9/00; F17C 9/02; F17C 2250/01; F17C 3/00;
(Continued)

(56) References Cited

U.S. PATENT DOCUMENTS 2,510,632 A * 6/1950 Hemphill ................. H02K 9/20
222/385
3,131,713 A * 5/1964 Kelley .................... F04B 43/08
137/340

(Continued)

FOREIGN PATENT DOCUMENTS

JP 04-335598 B2 11/1992
JP 2004-286404 A 10/2004
(Continued)

*Primary Examiner* — Frantz Jules
*Assistant Examiner* — Erik Mendoza-Wilkenfe
(74) *Attorney, Agent, or Firm* — Harness, Dickey & Pierce, P.L.C.

(57) ABSTRACT

Provided is a liquid supply system that can suppress a functional decline of relief valves and improve cooling efficiency. The system includes a sealed container (110), a pump (120) disposed in a cryogenic liquid (L) contained inside the sealed container (110) and driven by a linear actuator (130), a first conduit (K1) for directing the cryogenic liquid (L) pumped out by the pump (120) to a cooled device (300) provided outside the sealed container (110), a second conduit (K2) for returning the cryogenic liquid (L) from the cooled device (300) into the sealed container (110), and a relief valve (170) that is connected to the first conduit (K1) within the sealed container (110) and releases the cryogenic liquid (L) into the sealed container (110).

2 Claims, 3 Drawing Sheets

(51) Int. Cl.
*F17C 9/02* (2006.01)
*F17C 13/04* (2006.01)
*F16K 17/00* (2006.01)
*F25B 9/00* (2006.01)
*F25D 9/00* (2006.01)
*F25D 3/10* (2006.01)
*F25D 17/02* (2006.01)
*F25D 29/00* (2006.01)

(52) U.S. Cl.
CPC ........ *F25D 29/001* (2013.01); *F17C 2250/01* (2013.01); *H01L 2924/0002* (2013.01)

(58) Field of Classification Search
CPC ...... F17C 2205/0338; F17C 2205/0391; F17C 2205/0394; F17C 2250/0626; F25D 19/00; F25D 17/02; F25D 3/10; F25B 9/00; B67D 7/82; B67D 7/68; B67D 1/125; F04B 45/02; F04B 45/022; A61B 18/02; A61B 18/0218; F01B 3/0044; F01B 31/22
USPC ............. 62/50.4, 50.6; 606/21, 22; 137/340, 137/116.5; 417/417, 472, 473
See application file for complete search history.

(56) References Cited

U.S. PATENT DOCUMENTS

| | | | | |
|---|---|---|---|---|
| 3,482,591 A | * | 12/1969 | Dufresne | B67D 1/14 137/116.5 |
| 4,852,357 A | * | 8/1989 | Porter | F17C 9/00 62/50.4 |
| 6,575,712 B1 | * | 6/2003 | Slavchev | F03B 13/1855 417/330 |
| 7,083,612 B2 | * | 8/2006 | Littrup | A61B 18/02 606/21 |
| 7,192,426 B2 | * | 3/2007 | Baust | A61B 18/02 606/20 |
| 2003/0051486 A1 | * | 3/2003 | Ursan | F04B 15/08 62/50.6 |
| 2004/0055316 A1 | * | 3/2004 | Emmer | F17C 7/04 62/50.6 |
| 2007/0052290 A1 | * | 3/2007 | Hwang | B60T 7/122 303/115.1 |
| 2010/0180607 A1 | * | 7/2010 | Duong | F04B 15/08 62/50.6 |
| 2011/0033763 A1 | * | 2/2011 | Adcock | H01M 8/04007 429/429 |
| 2011/0152849 A1 | * | 6/2011 | Baust | A61B 18/02 606/21 |
| 2011/0245823 A1 | * | 10/2011 | Baust | A61B 18/02 606/22 |
| 2012/0189462 A1 | * | 7/2012 | Hurley | F17C 5/02 417/1 |

FOREIGN PATENT DOCUMENTS

| | | |
|---|---|---|
| JP | 2008-151269 A | 7/2008 |
| JP | 2008-215640 A | 9/2008 |
| JP | 2009-500587 A | 1/2009 |
| WO | 2007005091 A1 | 1/2007 |
| WO | 2012124363 A1 | 9/2012 |

* cited by examiner

LIQUID SUPPLY SYSTEM

CROSS-REFERENCE TO RELATED APPLICATIONS

This application is a National Stage of International Application No. PCT/JP2013/080818, filed Nov. 14, 2013 (now WO 2014/091866A1), which claims priority to Japanese Application No. 2012-273717, filed Dec. 14, 2012. The entire disclosures of each of the above applications are incorporated herein by reference.

FIELD

The present disclosure relates to a liquid supply system for supplying cryogenic liquids such as liquid nitrogen or liquid helium.

BACKGROUND

Conventionally, technologies for supplying a cryogenic liquid such as liquid nitrogen to a container that contains a superconducting coil or the like in order to maintain the superconducting coil in a cryogenic state have been known. In these technologies, a relief valve is provided for releasing the fluid out of the system so as to prevent damage to the system that may be caused by an excessive fluid pressure in a flow passage (see Patent Literature 1). In addition, because a maximized load or fluctuating load of pulsative pressure may possibly cause failures due to insufficient pressure resistance or fatigue, conventionally, a damper is provided in the piping system that supplies a cryogenic liquid in order to suppress the pressure fluctuation (see Patent Literature 2).

However, in the conventional examples mentioned above, due to a heat exchange that occurs in the parts such as the relief valve or damper and an unwanted release of the cryogenic liquid by the relief valve, decrease in cooling efficiency or reduction of liquid amount may be caused. There is yet another problem in which the relief valve does not function properly due to the icing of moisture or the like in the atmosphere.

CITATION LIST

Patent Literature

Patent Literature 1: Japanese Translation of PCT Application No. 2009-500587
Patent Literature 2: Japanese Patent Application Laid-open No. 2008-215640

SUMMARY

Technical Problem

An object of the present disclosure is to provide a liquid supply system that is capable of suppressing a functional decline of a relief valve and improving the cooling efficiency.

Solution to Problem

The present disclosure has adopted the following means in order to solve the above problem.

That is, a liquid supply system of the present disclosure is characterized by comprising: a sealed container; a pump disposed in a cryogenic liquid contained inside the sealed container and driven by a linear actuator; a first conduit for directing the cryogenic liquid pumped out by the pump to a cooled device provided outside the sealed container; a second conduit for returning the cryogenic liquid from the cooled device into the sealed container; and a first relief valve that is connected to the first conduit within the sealed container and releases the cryogenic liquid into the sealed container.

Accordingly, even if the liquid flow becomes insufficient for some reason, the internal pressure of the first conduit is prevented from exceeding a predetermined level.

In Addition, it is preferable that the liquid supply system further comprises a second relief valve that is connected to the pump within the sealed container and releases the cryogenic liquid into the sealed container.

Accordingly, even if the liquid flow becomes insufficient for some reason, the internal pressure of the pump is prevented from exceeding a predetermined level.

In addition, according to these disclosures, the relief valves are provided inside the sealed container. Thus, heat is not exchanged with the outside of the sealed container at the relief valves, and the cryogenic liquid is returned into the sealed container with its temperature kept extremely low. Accordingly, the cooling efficiency can be improved. In addition, functional decline of the relief valves due to the icing or the like can be suppressed.

In addition, set values for the opening pressure of the relief valves may be set to be lower than a maximum pressure of pulsation inside the first conduit and second conduit in a case where these relief valves were not provided. Accordingly, the maximum pressure of pulsation can be reduced.

In addition, in a case where a cryogenic fluid is divided into a liquid layer and a gas layer inside the sealed container, the relief valves may be disposed in the liquid layer. Accordingly, inclusion of gas into the flow passage where the cryogenic liquid flows is prevented.

It is preferable that the pump is formed to have a first pump chamber and a second pump chamber that are partitioned by a bellows and are fixed to a rod that is reciprocated by the linear actuator, wherein during a process in which the bellows contracts, the first pump chamber increases in volume while the second pump chamber reduces in volume, during a process in which the bellows expands, the first pump chamber decreases in volume while the second pump chamber increases in volume, and the pump is provided with a first inlet that sucks in the cryogenic liquid in the sealed container into the first pump chamber, and a first outlet that pumps out the sucked cryogenic liquid into the first conduit from inside of the first pump chamber, as well as a second inlet that sucks in the cryogenic liquid in the first container into the second pump chamber, and a second outlet that pumps out the sucked cryogenic liquid into the first conduit from inside of the second pump chamber.

By employing this configuration, when the bellows contracts, the cryogenic liquid is pumped out into the first conduit from inside of the second pump chamber and the cryogenic liquid is sucked into the first pump chamber, whereas when the bellows expands, the cryogenic liquid is sucked into the second pump chamber and the cryogenic liquid is pumped out into the first conduit from inside of the first pump chamber. Thus, the amount of liquid supplied by expansion and contraction of the bellows can be increased as compared to a case where the pumping function is created by only one pump chamber. In addition, in the case where the pumping function is created by only one pump chamber, the cryogenic liquid is supplied intermittently, whereas by employing the configuration described above, the cryogenic liquid is supplied in both occasions when the bellows contracts and when it expands. Therefore, as the cryogenic liquid is continuously supplied, the pulsation itself can be suppressed. Accordingly, as there will be no need to provide a damper outside the system, space-saving becomes possible and the cooling efficiency can be improved as compared to a case where a damper is provided outside the system.

The second relief valve may be provided to each of the first pump chamber and the second pump chamber. Accordingly, the internal pressure of each of the pump chambers is prevented from exceeding a predetermined level.

A damping structure may be provided in which a sealed space, into which the rod reciprocated by the linear actuator is inserted, is formed, and in the sealed space a layer of the cryogenic liquid and a layer of gas vaporized from the cryogenic liquid are formed, and to the sealed space a branch conduit branched from the first conduit is connected so that the pressure fluctuation of the cryogenic liquid supplied through the first conduit is damped.

By employing this configuration, a damping structure for damping the pressure fluctuation (pulsation) of the cryogenic liquid supplied through the first conduit is provided within the system. Accordingly, while space-saving is achieved and the cooling efficiency is improved, and in combination with the suppression of pulsation itself as described above, the pulsation can be synergistically suppressed. In addition, even if some liquid inside the sealed space is vaporized by the heat conducted from the linear actuator or atmosphere to the rod, it will only lead to an increase in the thickness of the gas layer that provides the damping function (functions as a gas damper). Therefore, vaporization inside the pump chamber is suppressed, and hence the pumping function is not declined.

Note that various configurations described above can be adopted in combinations as long as it is possible.

Advantageous Effects of the Disclosure

As described above, according to the present invention, a functional decline of a first or second relief valve is suppressed, and the cooling efficiency is improved.

DRAWINGS

DETAILED DESCRIPTION

Modes for carrying out the disclosure will be hereinafter exemplarily described in detail based on embodiments and examples with reference to the drawings. However, dimensions, materials, shapes, relative arrangements and so on of constituent parts described in the embodiments and examples are not intended to limit the scope of this disclosure to these alone in particular unless otherwise particularly specified.

(Embodiment)

Figure 1:
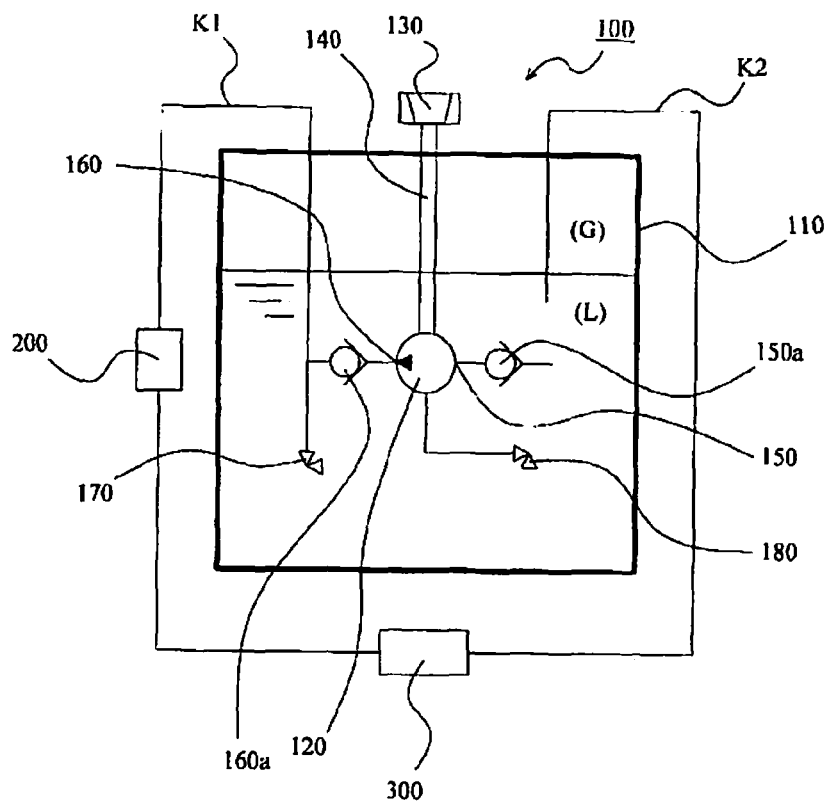
FIG. 1 is a schematic configuration diagram showing a liquid supply system according to one embodiment of the present disclosure in a usage state.
Figure 2:
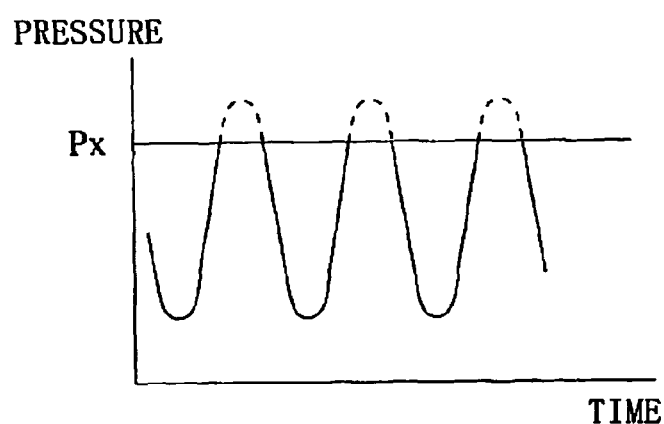
FIG. 2 is a graph showing pressure fluctuation.

The liquid supply system according to an embodiment of the present disclosure will be described with reference to FIG. 1 and FIG. 2.

<Liquid Supply System>

The overall configuration of the liquid supply system 100 according to the embodiment and its method of use will be described with reference to FIG. 1. The liquid supply system 100 according to the embodiment is a system for supplying a cryogenic liquid L to a cooled device 300. Note that specific examples of the cryogenic liquid L may be liquid nitrogen or liquid helium.

The liquid supply system 100 includes a sealed container 110 containing the cryogenic fluid, and a pump 120 driven by a linear actuator 130. Inside the sealed container 110, a layer of cryogenic liquid L and a layer of gas G vaporized from the cryogenic liquid L are formed. The pump 120 is disposed in the cryogenic liquid L contained inside the sealed container 110. The pump 120 is configured to be driven by a rod 140 reciprocated by the linear actuator 130. Further, an inlet 150 and an outlet 160 provided on the pump 120 includes a one-way valve 150a and a one-way valve 160a, respectively.

In addition, the liquid supply system 100 includes a first conduit K1 for directing the cryogenic liquid L pumped out by the pump 120 to the cooled device 300 provided outside the sealed container 110, and a second conduit K2 for returning the cryogenic liquid L from the cooled device 300 into the sealed container 110. In addition, a cooler 200 that cools the liquid to a cryogenic state is provided midway of the first conduit K1. By such a configuration, the cryogenic liquid L cooled by the cooler 200 circulates between the liquid supply system 100 and the cooled device 300.

The liquid supply system 100 according to the embodiment includes a first relief valve 170 that is connected to the first conduit K1 within the sealed container 110 and releases the cryogenic liquid L into the sealed container 110. The liquid supply system 100 also includes a second relief valve 180 that is connected to the pump 120 within the sealed container 110 and releases the cryogenic liquid L into the sealed container 110. Various known valve structures such as a poppet valve may be employed for the first relief valve 170 and the second relief valve 180. However, it must be noted that a material that does not suffer low-temperature embrittlement needs to be used for the material that constitutes the valve. For example, austenitic stainless steel may be employed as a metal material that constitutes a valve seat. In addition, polytetrafluoroethylene material or polyimide material may be employed as a material for a valve body.

According to the embodiment configured as described above, since the liquid supply system 100 includes the first relief valve 170, even if the flow of cryogenic liquid L becomes insufficient for some reason, the internal pressure of the first conduit K1 is prevented from exceeding a predetermined level. In addition, since the second relief valve 180 is included, even if the flow of cryogenic liquid L becomes insufficient for some reason, the internal pressure of the pump 120 is prevented from exceeding a predetermined level. As a result of these, possible damages to various parts due to an abnormal increase of the internal pressure can be prevented.

In addition, since the first relief valve 170 and the second relief valve 180 are provided inside the sealed container 110, heat is not exchanged with the outside of the sealed container 110 at these relief valves, and the cryogenic liquid L is returned into the sealed container 110 with its temperature kept extremely low. Thus the cooling efficiency can be improved. In addition, functional decline of these relief valves due to the icing or the like can be suppressed.

In addition, it is preferable that set values for the opening pressure of the first relief valve 170 and the second relief valve 180 are set to be lower than a maximum pressure of pulsation inside the first conduit K1 and the second conduit K2 in a case where these relief valves were not provided. Accordingly, the maximum pressure of pulsation can be reduced. Namely, as shown in FIG. 2, by setting Px as the set value for the opening pressure of the first relief valve 170 and the second relief valve 180, the maximum pressure inside the first conduit K1 and second conduit K2 can be kept equal to or lower than Px. Note that the broken lines in the drawing indicate the pressure fluctuation that would occur if the first relief valve 170 and the second relief valve 180 were not provided.

In addition, the first relief valve 170 and the second relief valve 180 can improve the cooling efficiency as described above, whether they are disposed in the liquid layer or in the gas layer, as long as they are inside the sealed container 110. By disposing these relief valves in the liquid layer, however, an effect of preventing inclusion of gas into the flow passage where the cryogenic liquid L flows can be exhibited as well. Namely, in a case where a gas remains in the flow passage of the cryogenic liquid L, the gas may vibrate and cause troubles such as pulsation. Therefore, if such troubles are to be avoided, the first relief valve 170 and the second relief valve 180 may be disposed in the liquid layer.

Hereinafter, more specific examples of the embodiment above will be described.

EXAMPLE 1

Figure 3:
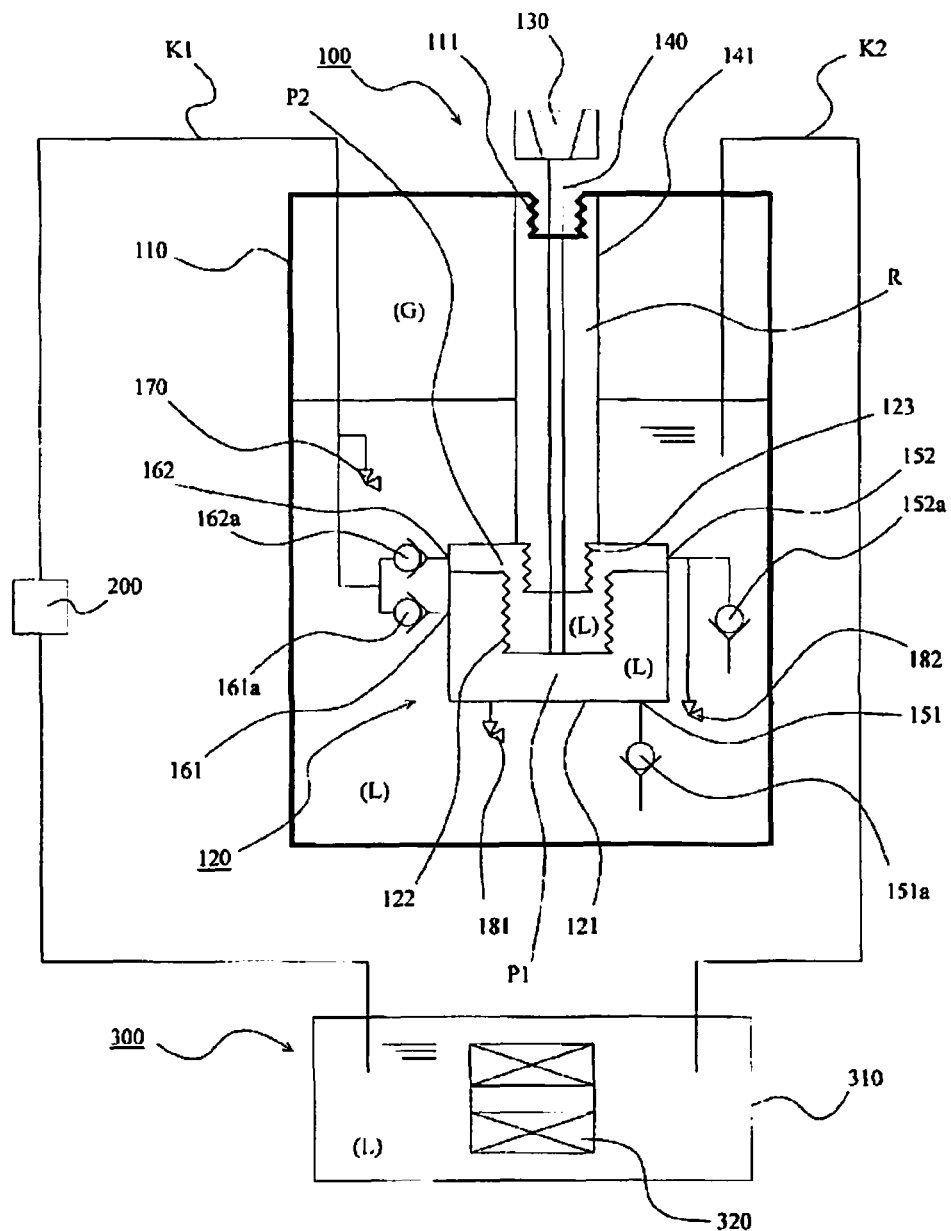
FIG. 3 is a schematic configuration diagram showing a liquid supply system according to Example 1 of the present disclosure in a usage state.

FIG. 3 shows Example 1 of the present disclosure. The configuration and operation thereof are basically the same as those of the embodiment described above, thus the same constituent parts are designated by the same reference signs, and the description thereof will be omitted as appropriate.

In the liquid supply system 100 according to this Example, a description will be given by using an example in which a cryogenic liquid L is supplied to a cooled device 300, which contains a superconducting coil 320 inside a resin-made container 310.

The pump 120 in this Example includes a housing 121 disposed in the cryogenic liquid L contained in a sealed container 110, and a bellows 122 disposed inside this housing 121. The opening of the housing 121 at its upper end in FIG. 3 is closed by a small bellows 123 to form a sealed space inside. The sealed space inside the housing 121 is partitioned by the bellows 122 mentioned above, to form a first pump chamber P1 and a second pump chamber P2.

The housing 121 is provided with a first inlet 151 that sucks in the cryogenic liquid L in the sealed container 110 into the first pump chamber P1, and a first outlet 161 that pumps out the sucked cryogenic liquid L into the first conduit K1 that is connected to the outside of the sealed container 110 from inside of the first pump chamber P1. The housing 121 is provided with a second inlet 152 that sucks in the cryogenic liquid L in the sealed container 110 into the second pump chamber P2, and a second outlet 162 that pumps out the sucked cryogenic liquid L into the first conduit K1 from inside of the second pump chamber P2. In addition, the first inlet 151 and the second inlet 152 are provided with one-way valves 151a and 152a, respectively, and the first outlet 161 and the second outlet 162 are also provided with one-way valves 161a and 162a, respectively.

In addition, a rod 140 that is configured to be reciprocated by a linear actuator 130 is entering the sealed container 110 from outside, and its distal end is fixed to the distal end of the bellows 122. Therefore, the bellows 122 expands and contracts as the rod 140 reciprocates.

In this Example, a sealed space R is formed around the rod 140. This sealed space R is formed by a tubular (preferably cylindrical) portion 141 into which the rod 140 that extends from outside of the sealed container 110 to the bellows 122 is inserted, and small bellows 123 and 111 are provided at the lower end and upper end of this tubular part 141, respectively. Note that the small bellows 123 that separates this sealed space R from the second pump chamber P2, and the small bellows 111 that separates this sealed space R from the outside space, are both fixed to the rod 140 at their distal ends, so that they expand and contract as the rod 140 reciprocates. The small bellows 123 and 111 are formed so that their outer diameters are smaller than the outer diameter of the bellows 122.

With the configuration described above, during a process in which the bellows 122 contracts, the first pump chamber P1 increases in volume while the second pump chamber P2 reduces in volume. Thus, during this process, the cryogenic liquid L is pumped out from inside of the second pump chamber P2 into the first conduit K1 via the second outlet 162, and the cryogenic liquid L is sucked into the first pump chamber P1 through the first inlet 151. In addition, during a process in which the bellows 122 expands, the first pump chamber P1 decreases in volume while the second pump P2 chamber increases in volume. Thus, during this process, the cryogenic liquid L is sucked into the second pump chamber P2 through the second inlet 152, and the cryogenic liquid L is pumped out from inside of the first pump chamber P1 into the first conduit K1 via the first outlet 161. As described, the cryogenic liquid L is pumped out to the first conduit K1 in both occasions when the bellows 122 contracts and when it expands.

The liquid supply system 100 according to this Example also includes a first relief valve 170 that is connected to the first conduit K1 within the sealed container 110 and releases the cryogenic liquid L into the sealed container 110. In addition, the liquid supply system 100 according to this Example includes a second relief valve 181 that is connected to the first pump chamber P1 within the sealed container 110 and releases the cryogenic liquid L into the sealed container 110, and a second relief valve 182 that is connected to the second pump chamber P2 within the sealed container 110 and releases the cryogenic liquid L into the sealed container 110.

<Advantages of the Liquid Supply System According to this Example>

As described above, with the liquid supply system 100 according to this Example, the same operations and effects as those of the embodiment described above can be obtained. Note that, in this Example, the first pump chamber P1 and the second pump chamber P2 are provided, and each of them is provided with the second relief valves 181 and 182, respectively. Thus the internal pressure of each of the respective pump chambers is prevented from exceeding a predetermined level.

In addition, in this Example, the first pump chamber P1 and the second pump chamber P2 are provided and the cryogenic liquid L is pumped out to the first conduit K1 in both occasions when the bellows 122 contracts and when it expands. Accordingly, the amount of liquid supplied by expansion and contraction of the bellows 122 can be increased (e.g., approximately doubled) as compared to a case where the pumping function is created by only one pump chamber. Thus, the amount of liquid supplied at one time with respect to a desired supply amount can be reduced (e.g., approximately by half) as compared to a case where the pumping function is created by only one pump chamber, and hence the maximum pressure of liquid in the first conduit K1 can be made lower. Therefore, the adverse effects of pressure fluctuation (pulsation) of supplied liquid can be suppressed.

Further, in the case where the pumping function is created by only one pump chamber, the cryogenic liquid L is supplied intermittently, whereas according to this Example, the cryogenic liquid L is supplied in both occasions when the bellows 122 contracts and when it expands. Therefore, as the cryogenic liquid L is continuously supplied, the pulsation itself can be suppressed. Consequently, as compared to a case where a damper is provided outside the system, space-saving can be achieved, and the cooling efficiency can be improved too because a number of portions where heat exchange occurs is decreased.

Furthermore, this Example adopts a configuration wherein the sealed space R is formed by the tubular part 141 and a pair of small bellows 123 and 111. The small bellows 123 and 111 are both fixed at their distal ends to the rod 140 so that they expand and contract as the rod 140 reciprocates. Therefore, as the sealed space R is formed without forming any sliding portions, no heat is generated due to friction resistance of sliding.

EXAMPLE 2

Figure 4:
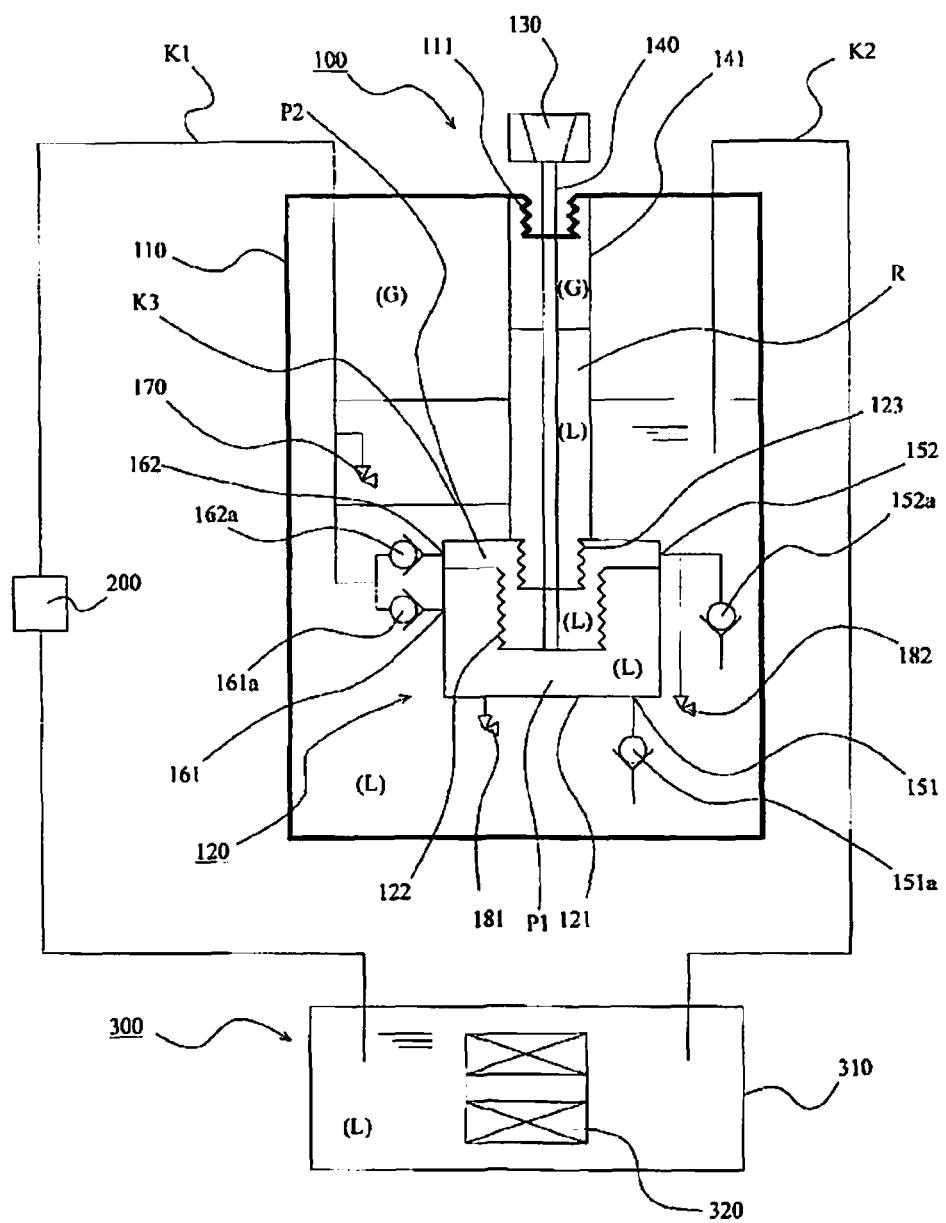
FIG. 4 is a schematic configuration diagram showing a liquid supply system according to Example 2 of the present disclosure in a usage state.

The liquid supply system 100 according to Example 2 of the present disclosure will be described with reference to FIG. 4. This Example shows a case where, based on the configuration of Example 1, a liquid layer and a gas layer are formed in the sealed space R into which the shaft is inserted to give a function as a gas damper. Other features in the configuration and operation thereof are the same as those of the embodiment and Example 1 described above, thus the same constituent parts are designated by the same reference signs, and the description thereof will be omitted.

In this Example, a damping structure for damping the pressure fluctuation (pulsation) of a cryogenic liquid L supplied through a first conduit K1 is provided around a rod 140. This damping structure includes a tubular (preferably cylindrical) portion 141 into which the rod 140 that extends from outside of a sealed container 110 to a bellows 122 is inserted, and small bellows 123 and 111 are provided at the lower end and upper end of this tubular part 141, respectively. The tubular part 141 and a pair of small bellows 123 and 111 form a sealed space R inside. Note that the small bellows 123 that separates this sealed space R from the second pump chamber P2, and the small bellows 111 that separates this sealed space R from the outside space, are both fixed to the rod 140 at their distal ends, so that they expand and contract as the rod 140 reciprocates. The small bellows 123 and 111 are formed so that their outer diameters are smaller than the outer diameter of the bellows 122.

Inside the sealed space R, a layer of cryogenic liquid L and a layer of gas G vaporized from the cryogenic liquid L are formed. The temperature is stable in a lower side of the sealed space R (at about 70 K in case of liquid nitrogen), while it becomes higher toward the upper side that is exposed to the outside air. A liquid-gas interface between the layer of cryogenic liquid L and the layer of gas G is formed around a point of saturation temperature (of about 78 K in case of liquid nitrogen).

A branch conduit K3 branched from the first conduit K1 and connected to this sealed space R is provided. Accordingly, the pressure of the cryogenic liquid L supplied through the first conduit K1 is applied also to the sealed space R, thus the gas inside the sealed space R functions as a damper. Therefore, the pressure fluctuation (pulsation) of the cryogenic liquid L supplied through the first conduit K1 can be damped.

<Advantages of the Liquid Supply System According to this Example>

As described above, with the liquid supply system 100 according to this Example too, the same operations and effects as those of the embodiment and Example 1 described above can be obtained. In addition, in the liquid supply system 100 according to this Example, a damping structure for damping the pressure fluctuation (pulsation) of the cryogenic liquid L supplied through the first conduit K1 is provided within the system. Therefore, pulsation can be suppressed even more compared to the cases in the embodiment and Example 1 described above.

In addition, in this Example, a structure in which the inside of the tubular part 141, where the rod 140 is inserted, is formed as the sealed space R and the layer of the cryogenic liquid L and the layer of gas G are formed inside this space is employed as the damping structure. Therefore, as the layer of gas G exhibits a function of retarding heat conduction, conduction of heat that is generated in the linear actuator 130 or atmospheric heat to the cryogenic liquid L is suppressed. In addition, even if heat is conducted to the cryogenic liquid L and the liquid vaporizes, new cryogenic liquid L is constantly supplied, and a cooling effect can be achieved. Thus, it can only lead to an increase in the thickness of the layer of gas G that provides damping function (function as a gas damper) in the sealed space R. Therefore, it is possible to prevent the temperature inside the pump chamber from reaching the point where the cryogenic liquid L vaporizes, and hence the pumping function is not declined.

REFERENCE SIGNS LIST

100: Liquid supply system
110: Sealed container
111, 123: Small bellows
120: Pump
121: Container
122: Bellows
130: Linear actuator
140: Rod
141: Tubular part
150: Inlet
150a, 151a, 152a, 160a, 161a, 162a: One-way valve
151: First inlet
152: Second inlet
160: Outlet
161: First outlet
162: Second outlet
170: First relief valve
180, 181, 182: Second relief valve
200: Cooler
300: Cooled device
310: Container
320: Superconducting coil
K1: First conduit
K2: Second conduit
K3: Branch conduit
P1: First pump chamber P2: Second pump chamber
R: Sealed space

The invention claimed is:
1. A liquid supply system comprising:
a sealed container;
a pump disposed in a cryogenic liquid contained inside the sealed container and having a pump chamber driven by a linear actuator so as to have a variable volume;
a first conduit for directing the cryogenic liquid pumped out from the pump chamber to a cooled device provided outside the sealed container;
a second conduit for returning the cryogenic liquid from the cooled device into the sealed container;
an inlet provided in the pump that sucks in the cryogenic liquid in the sealed container into the pump chamber;
an outlet provided in the pump that pumps out the sucked cryogenic liquid into the first conduit from inside of the pump chamber;
a pair of one-way valves, each of which is provided in the inlet and the outlet, respectively;
a first relief valve connected to the first conduit within the sealed container and configured to release the cryogenic liquid into the sealed container; and
a second relief valve in communication with the pump chamber within the sealed container in order to prevent an internal pressure of the cryogenic liquid in the pump chamber from exceeding a predetermined level and configured to release the cryogenic liquid in the pump chamber into the sealed container, wherein
an entire passage from the first conduit to the first relief valve, the first relief valve and the second relief valve are disposed in the cryogenic fluid.

2. The liquid supply system according to claim 1, wherein the pump chamber is driven by a rod entering the sealed container from outside and configured to be reciprocated by the linear actuator.

* * * * *